United States Patent
Ichikawa

(10) Patent No.: US 6,593,647 B2
(45) Date of Patent: Jul. 15, 2003

(54) SEMICONDUCTOR DEVICE

(75) Inventor: Sunji Ichikawa, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/108,357

(22) Filed: Mar. 29, 2002

(65) Prior Publication Data

US 2002/0190391 A1 Dec. 19, 2002

(30) Foreign Application Priority Data

Jun. 15, 2001 (JP) ........................... 2001-182506

(51) Int. Cl.⁷ .............................................. H01L 23/02
(52) U.S. Cl. .................... 257/686; 257/724; 257/777; 257/782; 257/783; 257/784; 257/786; 257/787
(58) Field of Search ................................. 257/685, 686, 257/687, 690, 723, 724, 730, 777, 782, 783, 784, 786, 787; 438/106, 109, 118, 125, 126, 127

(56) References Cited

U.S. PATENT DOCUMENTS

| 5,903,049 A | * | 5/1999 | Mori ........................... 257/686 |
| 6,215,182 B1 | * | 4/2001 | Ozawa et al. ................. 257/723 |
| 6,407,456 B1 | * | 6/2002 | Ball .............................. 257/777 |
| 6,414,384 B1 | * | 7/2002 | Lo et al. ...................... 257/685 |
| 6,452,279 B2 | * | 9/2002 | Shimoda ...................... 257/777 |
| 2002/0158325 A1 | * | 10/2002 | Yano et al. .................. 257/686 |

FOREIGN PATENT DOCUMENTS

| JP | 63-104343 | * | 5/1988 |
| JP | 58-92230 | * | 6/1993 |
| JP | 10-70232 | * | 3/1998 |

* cited by examiner

Primary Examiner—David L. Talbott
Assistant Examiner—Alonzo Chambliss
(74) Attorney, Agent, or Firm—Rabin & Berdo, PC

(57) ABSTRACT

This invention provides a semiconductor device and its manufacturing method capable of mounting a plurality of semiconductor elements without reducing the reliability of the semiconductor device. More specifically, this invention provides a semiconductor device and its manufacturing method comprising: a printed wiring board with a wiring pattern; a first semiconductor element mounted on a predetermined location on the printed wiring board and having a plane with a first region in which an electrode pad is formed and a second region, the internal region of the first region; an auxiliary member mounted on the second region of the first semiconductor element and having a plane with a first region in which a wiring pattern is formed and a second region, the internal region of the first region; and a second semiconductor element mounted on the second region of the auxiliary member and having a plane with an electrode pad formed; and wherein: the electrode pad of the first semiconductor element and the wiring pattern of the printed wiring board are electrically connected to each other; the electrode pad of the second semiconductor element and the wiring pattern of the auxiliary member are electrically connected to each other; the wiring pattern of the auxiliary member and the wiring pattern of the printed wiring board are electrically connected to each other; and the first semiconductor element and the second semiconductor element are resin-sealed.

12 Claims, 7 Drawing Sheets

SEMICONDUCTOR DEVICE

BACKGROUND OF THE INVENTION

1. Field of the Invention

The present invention relates to a semiconductor device. More specifically, the present invention relates to a semiconductor device of chip on board (COB) type with a plurality of semiconductor elements mounted on a printed wiring board.

2. Prior Art

A conventional semiconductor manufacturing method with a plurality of semiconductor elements mounted will be described in reference to FIG. 9. A first semiconductor element 601 is adhered to a predetermined location on a printed wiring board 606 with a die bonding material 603, as shown in FIG. 9. Then a second semiconductor element 602 smaller than that of the first semiconductor element 601 is similarly adhered to a predetermined location with a die bonding material 608.

Next, a wiring pattern 605 provided on the printed wiring board 606 and the semiconductor element 601 are electrically connected to each other via a thin wire for connection (Au wire, Al wire and the like) 604. Then the wiring pattern 605 and the semiconductor element 602 are electrically connected to each other via a thin wire for connection (Au wire, Al wire and the like) 609.

After that, resin sealing is achieved by an epoxy resin 607 to protect the first semiconductor element 601, the second semiconductor element 602 and the thin wires for connection 604 and 609. Thereby the semiconductor device is completed.

In the above conventional method however, the smaller the second semiconductor element becomes, the longer the thin wire for connection becomes. For this reason, the problem arises that the shape of the thin wire for connection changes to short with the adjacent thin wire for connection. As a result, the reliability of the semiconductor device becomes reduced.

The object of the present invention is to provide a novel and improved semiconductor device on which a plurality of semiconductor element can be mounted without reducing the reliability of the semiconductor device.

SUMMARY OF THE INVENTION

In the typical present invention to achieve the above object, there is provided a semiconductor device comprising: a printed wiring board with a wiring pattern; a first semiconductor element mounted on a predetermined location on the printed wiring board and having a plane with a first region in which an electrode pad is formed and a second region, the internal region of the first region; an auxiliary member mounted on the second region of the first semiconductor element and having a plane with a first region in which a wiring pattern is formed and a second region, the internal region of the first region; and a second semiconductor element mounted on the second region of the auxiliary member and having a plane with an electrode pad formed; and wherein: the electrode pad of the first semiconductor element and the wiring pattern of the printed wiring board are electrically connected to each other; the electrode pad of the second semiconductor element and the wiring pattern of the auxiliary member are electrically connected to each other; the wiring pattern of the auxiliary member and the wiring pattern of the printed wiring board are electrically connected to each other; and the first semiconductor element and the second semiconductor element are resin-sealed.

In the above-described invention, since the first and second semiconductor elements are connected by a thin wire for connection to each other, the length of the thin wire for connection can be shorter than the conventional one. As a result, even if a smaller second semiconductor element is mounted, the shape of the thin wire for connection does not change and the thin wire for connection can be prevented from shorting with the adjacent thin wire for connection, so that the semiconductor device with high reliability can be provided.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DETAILED DESCRIPTION OF THE PREFERRED EMBODIMENTS

Figure 1:
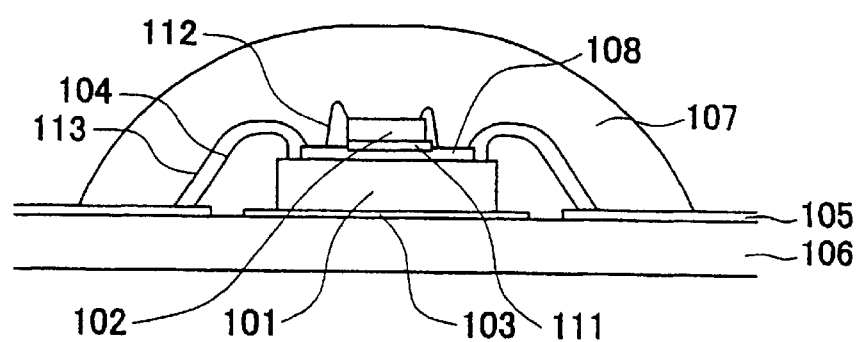
FIG. 1 is a sectional view showing the structure of a semiconductor device in the first embodiment.

Hereinafter, the preferred embodiment of the present invention will be described in reference to the accompanying drawings. Same reference numerals are attached to components having same functions in following description and the accompanying drawings, and a description thereof is omitted.

(First Embodiment)

Figure 2A:
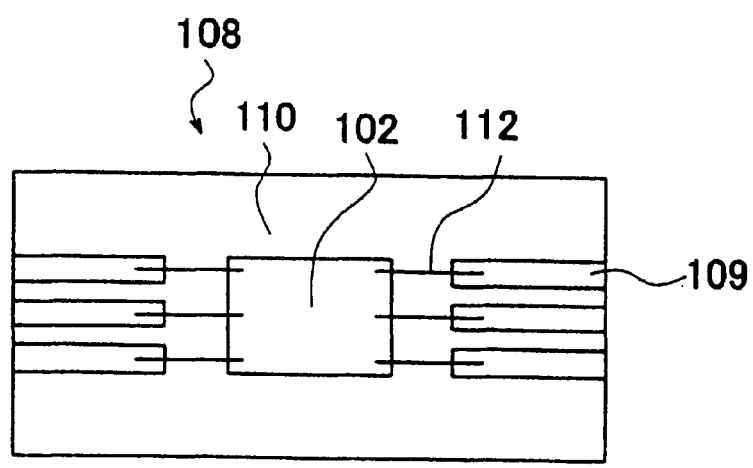
FIGS. 2a and 2b are a sectional view showing the structure of an auxiliary member in the first embodiment.
Figure 2B:
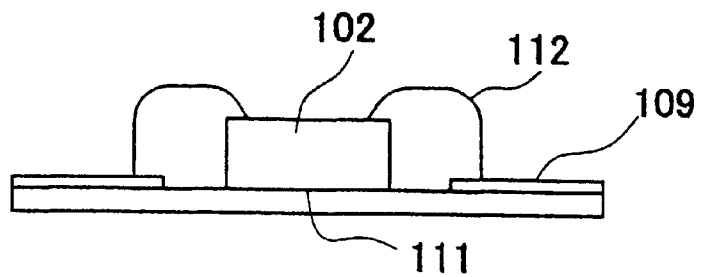

First, a semiconductor device in the first embodiment will be explained in reference to FIGS. 1 and 2. FIG. 1 is a sectional view showing the structure of a semiconductor device in the first embodiment. FIG. 2 is a sectional view showing the structure of an auxiliary member in the first embodiment.

A semiconductor integrated circuit (first semiconductor element) 101 is adhered to a predetermined location on a printed wiring board 106 with a die bonding material 103, as shown in FIG. 1. An auxiliary member 108 in this embodiment is adhered to a location within a wiring pattern 105 formed at the periphery of the first semiconductor element 101 with a die bonding material 103.

As shown in FIG. 2, the auxiliary member 108 in this embodiment comprises a die bonding part 110 for mounting a second semiconductor element 102 and a wiring pattern part 109 for connecting electrically to the second semiconductor element 102.

The second semiconductor integrated circuit (second semiconductor element) 102 is adhered to a die bonding part 110 on the auxiliary member 108 with a die bonding material 111, similarly to the first semiconductor element 101.

A wiring pattern 105 provided on the printed wiring board 106 and the first semiconductor element 101 are electrically connected to each other via a thin wire for connection (Au wire, Al wire and the like) 104. In addition, a wiring pattern 109 provided on the auxiliary member 108 and the second semiconductor element 102 are electrically connected to each other via a thin wire for connection 112 while the wiring pattern 109 and the wiring pattern 105 provided on the printed wiring board 106 are electrically connected to each other via a thin wire for connection 113.

Further, resin sealing is achieved by an epoxy resin 107 to protect the first semiconductor element 101, the second semiconductor element 102, the auxiliary member 108 and the thin wires for connection 104, 112 and 113.

Hereafter, a method for manufacturing a semiconductor device will be described in this embodiment in reference to FIGS. 1 and 2.

The semiconductor integrated circuit (first semiconductor element) 101 is adhered to a predetermined location on the printed wiring board 106 with the die bonding material 103, as shown in FIG. 1. Next, the auxiliary member 108 is adhered to a location within the wiring pattern 105 formed at the periphery of the first semiconductor element 101 with the die bonding material 103.

As shown in FIG. 2, the auxiliary member 108 in this embodiment comprises the die bonding part 110 for mounting the second semiconductor element 102 and the wiring pattern part 109 for connecting electrically to the second semiconductor element 102.

Next, the second semiconductor integrated circuit (second semiconductor element) 102 is adhered with the die bonding material 111, similarly to the first semiconductor element 101.

The wiring pattern 105 provided on the printed wiring board 106 and the first semiconductor element 101 are electrically connected to each other via the thin wire for connection (Au wire, Al wire and the like) 104.

Next, the wiring pattern 109 provided on the auxiliary member 108 and the second semiconductor element 102 are electrically connected to each other via the thin wire for connection 112 while the wiring pattern 109 and the wiring pattern 105 provided on the printed wiring board 106 are electrically connected to each other via the thin wire for connection 113.

Finally, resin sealing is achieved by the epoxy resin 107 to protect the first semiconductor element 101, the second semiconductor element 102, the auxiliary member 108 and the thin wires for connection 104, 112 and 113. Thereby the semiconductor device is completed.

In this embodiment, since the wiring pattern 105 provided on the printed wiring board 106 and the second semiconductor element 102 are connected by a thin wire for connection to each other, the length of the thin wire for connection can be shorter than the conventional one. As a result, even if a smaller second semiconductor element is mounted, the shape of the thin wire for connection does not change and the thin wire for connection can be prevented from shorting with the adjacent thin wire for connection, so that the semiconductor device with high reliability can be provided.

(Second Embodiment)

Figure 3:
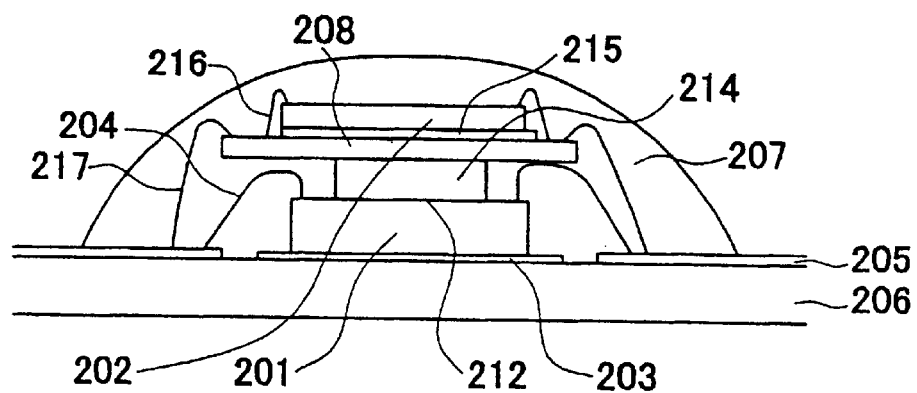
FIG. 3 is a sectional view showing the structure of a semiconductor device in the second embodiment.
Figure 4A:
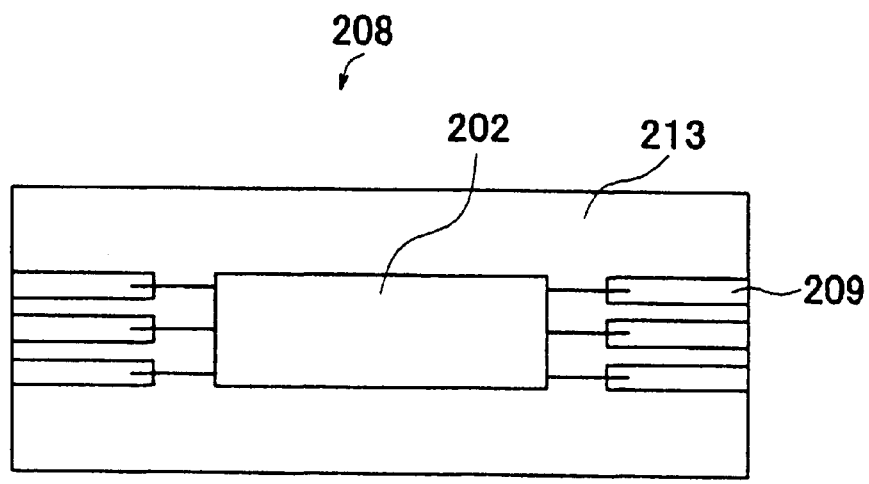
FIGS. 4a and 4b are is a sectional view showing the structure of an auxiliary member in the second embodiment.
Figure 4B:
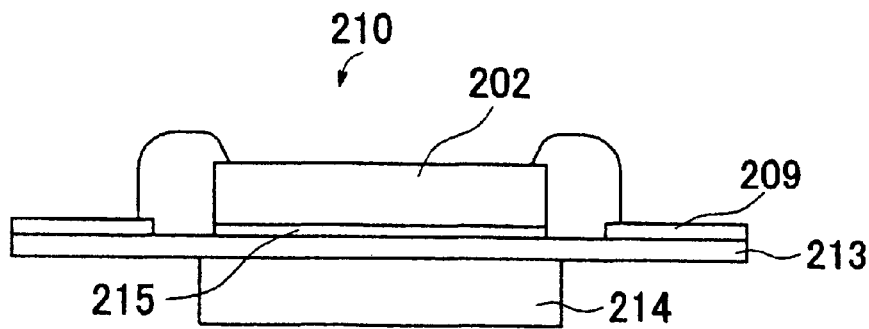

In this embodiment, there is provided a semiconductor device on which a larger second semiconductor element can be mounted. Hereafter, the second embodiment will be explained in reference to FIGS. 3 and 4. FIG. 3 is a sectional view showing the structure of a semiconductor device in the second embodiment. FIG. 4 is a sectional view showing the structure of an auxiliary member in the second embodiment.

A semiconductor integrated circuit (first semiconductor element) 201 is adhered to a predetermined location on a printed wiring board 206 with a die bonding material 203, as shown in FIG. 3. The first semiconductor element 201 and a wiring pattern 205 provided on the printed wiring board 206 are electrically connected to each other via a thin wire for connection (Au wire, Al wire and the like) 204.

In this embodiment, an auxiliary member 208 is mounted on the first semiconductor element 201 and adhered with a die bonding material 212 so that a supporting part 214 with a substantially protruding shape on the auxiliary member 208 may be located within an electrode pad formed at the periphery of the first semiconductor element 201.

As shown in FIG. 4, the auxiliary member 208 in this embodiment comprises a die bonding part 210 for mounting a second semiconductor element 202, a member 213 the surface on which a wiring pattern part 209 for connecting electrically to the second semiconductor element 202 is formed and the supporting part 214 with a substantially protruding shape formed on the rear surface of the member 213.

As described above, since the auxiliary member in this embodiment is mounted so that the supporting part with a substantially protruding shape may be located within an electrode pad formed at the periphery of the first semiconductor element, a larger second semiconductor element can be mounted. Also, even a second semiconductor element with an arbitrary size can be mounted.

The second semiconductor element 202 is adhered to a die bonding part 210 on the auxiliary member 208 with a die bonding material 215, similarly to the first semiconductor element 201.

In addition, a wiring pattern 209 provided on the auxiliary member 208 and the second semiconductor element 202 are electrically connected to each other via a thin wire for connection (Au wire, Al wire and the like) 216 while the wiring pattern 209 provided on the auxiliary member 208 and the wiring pattern 205 provided on the printed wiring board 206 are electrically connected to each other via a thin wire for connection 217.

Further, resin sealing is achieved by an epoxy resin 207 to protect the first semiconductor element 201, the second semiconductor element 202, the auxiliary member 208 and the thin wires for connection 204, 216 and 217.

Hereafter, a method for manufacturing a semiconductor device will be described in this embodiment in reference to FIG. 3.

The semiconductor integrated circuit (first semiconductor element) 201 is adhered to a predetermined location on the printed wiring board 206 with the die bonding material 203, as shown in FIG. 3. Next, the wiring pattern 205 provided on the printed wiring board 206 and the first semiconductor element 201 are electrically connected to each other via the thin wire for connection (Au wire, Al wire and the like) 204.

The auxiliary member 208 is mounted on the first semiconductor element 201 and adhered with the die bonding material 212 so that the supporting part 214 with a substantially protruding shape may be located within an electrode pad formed at the periphery of the first semiconductor element 201.

As shown in FIG. 4, the auxiliary member 208 in this embodiment comprises the die bonding part 210 for mounting the second semiconductor element 202, the member 213 the surface on which a wiring pattern part 209 for connecting electrically to the second semiconductor element 202 is formed and the supporting part 214 with a substantially protruding shape formed on the rear surface of the member 213.

As described above, since the auxiliary member in this embodiment is mounted so that the supporting part with a substantially protruding shape may be located within an electrode pad formed at the periphery of the first semiconductor element, a larger second semiconductor element can be mounted. In addition, since the auxiliary member is mounted after the thin wire for connection of the first semiconductor element is connected, each connection of each thin wire for connection is not disrupted even in mounting a larger semiconductor element. Also, even a second semiconductor element with an arbitrary size can be mounted.

Next, the second semiconductor element 202 is adhered to the die bonding part 210 on the auxiliary member 208 with the die bonding material 215, similarly to the first semiconductor element 201.

After that, the wiring pattern 209 provided on the auxiliary member 208 and the second semiconductor element 202 are electrically connected to each other via the thin wire for connection (Au wire, Al wire and the like) 216. Then the wiring pattern 209 provided on the auxiliary member 208 and the wiring pattern 205 provided on the printed wiring board 206 are electrically connected to each other via the thin wire for connection (Au wire, Al wire and the like) 217.

Finally, resin sealing is achieved by the epoxy resin 207 to protect the first semiconductor element 201, the second semiconductor element 202, the auxiliary member 208 and the thin wires for connection 204, 216 and 217. Thereby the semiconductor device is completed.

In this embodiment, since the auxiliary member is mounted so that the supporting part with a substantially protruding shape provided on the auxiliary member may be located within an electrode pad formed at the periphery of the first semiconductor element, a larger second semiconductor element can be mounted. In addition, since the auxiliary member is mounted after the thin wire for connection of the first semiconductor element is connected, each connection of each thin wire for connection is not disrupted even in mounting a larger semiconductor element. Also, even a second semiconductor element with an arbitrary size can be mounted.

(Third Embodiment)

Figure 5:
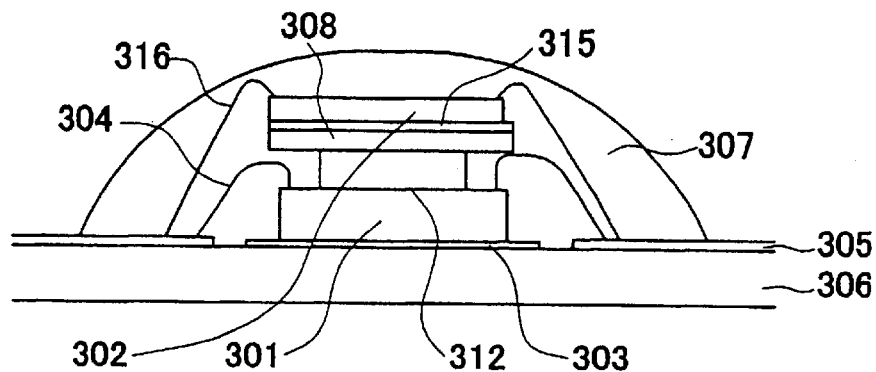
FIG. 5 is a sectional view showing the structure of a semiconductor device in the third embodiment.

In this embodiment, a semiconductor device can be further smaller. Hereafter, the third embodiment will be explained in reference to FIG. 5. FIG. 5 is a sectional view showing the structure of a semiconductor device in the third embodiment.

A semiconductor integrated circuit (first semiconductor element) 301 is adhered to a predetermined location on a printed wiring board 306 with a die bonding material 303, as shown in FIG. 5. The first semiconductor element 301 and a wiring pattern 305 provided on the printed wiring board 306 are electrically connected to each other via a thin wire for connection (Au wire, Al wire and the like) 304.

In this embodiment, an auxiliary member 308 consisting of, for example, an epoxy resin and the like, is mounted on the first semiconductor element 301 and adhered with a die bonding material 312 so that a supporting part with a substantially protruding shape on the auxiliary member 308 may be located within an electrode pad formed at the periphery of the first semiconductor element 301. At this time, the auxiliary member 308 is mounted so as not to change the shape of the thin wire for connection 304. It is to be noted that the auxiliary member 308 in this embodiment comprises a member larger than a second semiconductor element by, for example, 0.1 mm, for mounting the second semiconductor element on the surface thereof, and a supporting part with a substantially protruding shape formed on the rear surface of the member.

A second semiconductor element 302 is adhered to the auxiliary member 308 with a die bonding material 315, similarly to the first semiconductor element 301.

In addition, the second semiconductor element 302 and a wiring pattern 305 provided on the printed wiring board 306 are electrically connected to each other via a thin wire for connection (Au wire, Al wire and the like) 316. Further, resin sealing is achieved by an epoxy resin 307 to protect the first semiconductor element 301, the second semiconductor element 302, the auxiliary member 312 and the thin wires for connection 304 and 316.

Hereafter, a method for manufacturing a semiconductor device will be described in this embodiment in reference to FIG. 5.

The first semiconductor integrated circuit (first semiconductor element) 301 is adhered to a predetermined location on the printed wiring board 306 with the die bonding material 303, as shown in FIG. 5. Next, the wiring pattern 305 provided on the printed wiring board 306 and the first semiconductor element 301 are electrically connected to each other via the thin wire for connection (Au wire, Al wire and the like) 304.

The auxiliary member 308 consisting of, for example, an epoxy resin and the like, is mounted on the first semiconductor element 301 and adhered with the die bonding material 312 so that a supporting part with a substantially protruding shape may be located within an electrode pad formed at the periphery of the first semiconductor element 301, so as not to change the shape of the thin wire for connection 304. It is to be noted that the auxiliary member 308 in this embodiment comprises the member larger than the second semiconductor element by, for example, 0.1 mm, for mounting the second semiconductor element on the surface thereof, and the supporting part with a substantially protruding shape formed on the rear surface of the member.

Next, the second semiconductor element 302 is adhered to the auxiliary member 308 with the die bonding material 315, similarly to the first semiconductor element 201.

After that, the second semiconductor element 302 and the wiring pattern 305 provided on the printed wiring board 306 are electrically connected to each other via the thin wire for connection (Au wire, Al wire and the like) 316.

Finally, resin sealing is achieved by an epoxy resin 307 to protect the first semiconductor element 301, the second semiconductor element 302, the auxiliary member 312 and the thin wires for connection 304 and 316. Thereby the semiconductor device is completed.

In this embodiment, since the second semiconductor element and the wiring pattern provided on the printed wiring board are directly connected, a small auxiliary member can be used without forming a wiring pattern on the auxiliary member. As a result, since the width of the resin-application area in the semiconductor device is reduced, the size of the semiconductor device can be small. In addition, since the auxiliary member is mounted so that the supporting part with a substantially protruding shape provided on the auxiliary member may be located within an electrode pad formed at the periphery of the first semiconductor element, a larger second semiconductor element can be mounted. In addition, since the auxiliary member is mounted after the thin wire for connection of the first semiconductor element is connected, each connection of each thin wire for connection is not disrupted even in mounting a larger semiconductor element. Also, even a second semiconductor element with an arbitrary size can be mounted.

(Fourth Embodiment)

Figure 6:
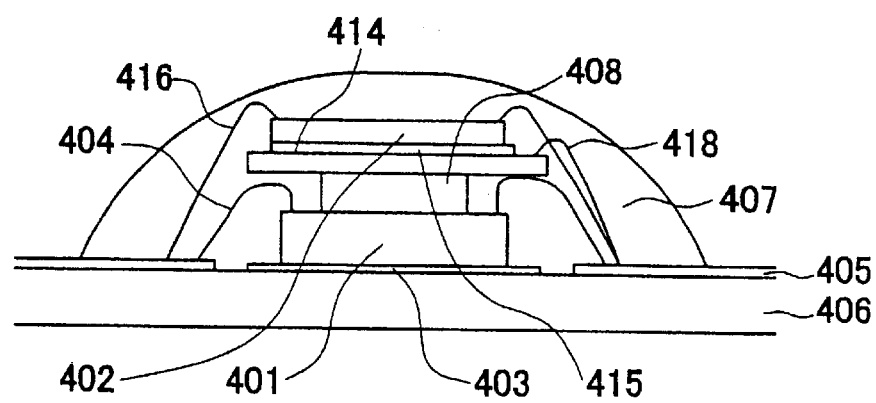
FIG. 6 is a sectional view showing the structure of a semiconductor device in the fourth embodiment.
Figure 7:
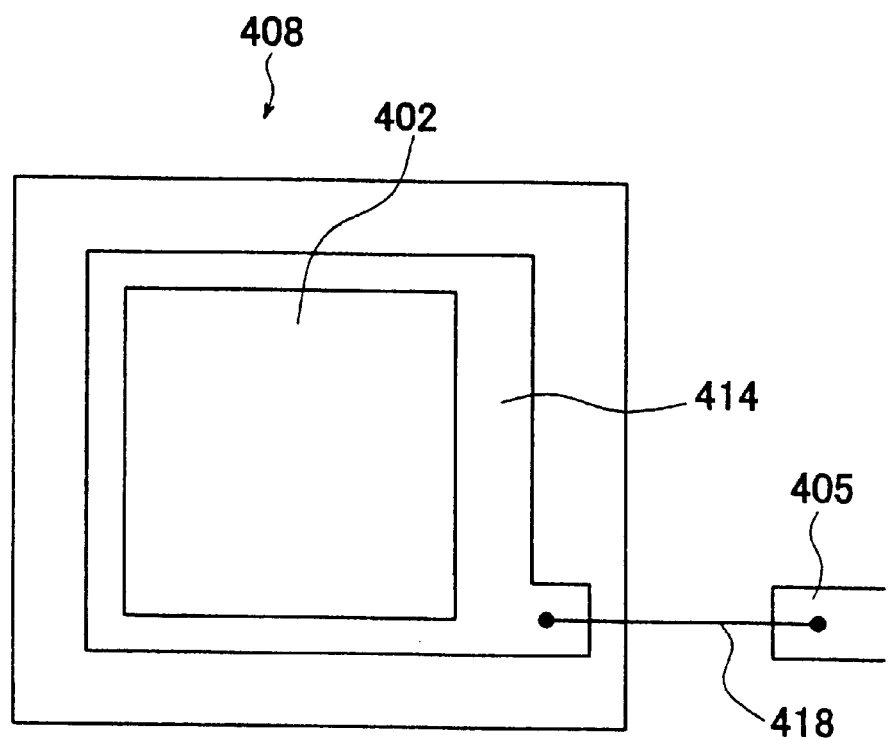
FIG. 7 is a sectional view showing the structure of an auxiliary member in the fourth embodiment.

In this embodiment, a semiconductor element forming a potential on the rear surface of the second semiconductor element, for example, a semiconductor element with SOI structure, can be mounted. Hereafter, the fourth embodiment will be explained in reference to FIGS. 6 and 7. FIG. 6 is a sectional view showing the structure of a semiconductor device in the fourth embodiment. FIG. 7 is a sectional view showing the structure of an auxiliary member in the fourth embodiment.

A first semiconductor element 401 is adhered to a predetermined location on a printed wiring board 406 with a die bonding material 403, as shown in FIG. 6. The first semiconductor element 401 and a wiring pattern 405 provided on the printed wiring board 406 are electrically connected to each other via a thin wire for connection (Au wire, Al wire and the like) 404.

In this embodiment, an auxiliary member 408 is mounted on the first semiconductor element 401 and adhered with a die bonding material 403 so that a supporting part with a substantially protruding shape on the auxiliary member 408 may be located within an electrode pad formed at the periphery of the first semiconductor element 401. At this time, the auxiliary member 408 is mounted so as not to change the shape of the thin wire for connection. It is to be noted that the auxiliary member 408 consisting of, for example, an epoxy resin and the like, in this embodiment comprises a member larger than the second semiconductor element by, for example, 0.5 mm, for mounting the second semiconductor element on the surface thereof, and the supporting part with a substantially protruding shape formed on the rear surface of the member, as shown in FIG. 7. The reason for this is that it is necessary to provide a region for forming a connection part to connect with other wiring patterns.

An electroconductive film, for example, Au plate and the like, is formed at a predetermined region on the surface of a member in this embodiment including a die bonding part for mounting the second semiconductor element. The member can be electrically connected to the rear surface of the mounted second semiconductor element via this electroconductive film while the member on which the electroconductive film at a predetermined region where the second semiconductor element is not mounted is formed can be electrically connected to other wiring patterns via a thin wire for connection.

Since a member larger than the second semiconductor element by about 0.5 mm is adopted as an auxiliary member in this embodiment, an electroconductive film for connecting with all over the rear surface of the second semiconductor element can be formed and a connection part for connecting a thin wire for connection can be formed.

A second semiconductor element 402 is adhered to a die bonding part on which an electroconductive film 414 is formed with a die bonding material 415.

In addition, the second semiconductor element 402 and a wiring pattern 405 provided on the printed wiring board 406 are electrically connected to each other via a thin wire for connection (Au wire, Al wire and the like) 416. An electroconductive film part (cavity part) 414 on the auxiliary part 408 and a wiring pattern (ground pattern) provided on the printed wiring board 406 are electrically connected to each other via a thin wire for connection (Au wire, Al wire and the like) 418.

Further, resin sealing is achieved by an epoxy resin 407 to protect the first semiconductor element 401, the second semiconductor element 402, the auxiliary member 408 and the thin wires for connection 404, 416 and 418.

Hereafter, a method for manufacturing a semiconductor device will be described in this embodiment in reference to FIGS. 6 and 7.

The first semiconductor element 401 is adhered to a predetermined location on the printed wiring board 406 with the die bonding material 403, as shown in FIG. 6. Next, the wiring pattern 405 provided on the printed wiring board 406 and the first semiconductor element 401 are electrically connected to each other via the thin wire for connection (Au wire, Al wire and the like) 404.

The auxiliary member 408 is mounted on the first semiconductor element 401 and adhered with the die bonding material 403 so that a supporting part with a substantially protruding shape may be located within an electrode pad formed at the periphery of the first semiconductor element 401, so as not to change the shape of the thin wire for connection. It is to be noted that the auxiliary member 408 consisting of, for example, an epoxy resin and the like, in this embodiment comprises the member larger than the second semiconductor element by, for example, 0.5 mm, for mounting the second semiconductor element on the surface thereof, and the supporting part with a substantially protruding shape formed on the rear surface of the member, as shown in FIG. 7. The reason for this is that it is necessary to provide a region for forming a connection part to connect with other wiring patterns.

An electroconductive film, for example, Au plate and the like, is formed at a predetermined region on the surface of a member in this embodiment including a die bonding part for mounting the second semiconductor element. The member can be electrically connected to the rear surface of the mounted second semiconductor element via this electroconductive film while the member on which the electroconductive film at a predetermined region where the second semiconductor element is not mounted is formed can be electrically connected to other wiring patterns via a thin for connection.

Since a member larger than the second semiconductor element by about 0.5 mm is adopted as an auxiliary member in this embodiment, an electroconductive film for connecting with all over the rear surface of the second semiconductor element can be formed and a connection part for connecting a thin wire for connection can be formed.

Next, a second semiconductor element 402 is adhered to a die bonding part on which an electroconductive film 414 is formed with a die bonding material 415.

After that, the second semiconductor element 402 and a wiring pattern 405 provided on the printed wiring board 406 are electrically connected to each other via a thin wire for connection (Au wire, Al wire and the like) 416. The electroconductive film part (cavity part) 414 on the auxiliary part 408 and a wiring pattern provided on the printed wiring board 406 are electrically connected to each other via a thin wire for connection (Au wire, Al wire and the like) 418.

Further, resin sealing is achieved by the epoxy resin 407 to protect the first semiconductor element 401, the second semiconductor element 402, the auxiliary member 408 and the thin wires for connection 404, 416 and 418. Thereby the semiconductor device is completed.

In this embodiment, since the electroconductive film part (cavity part) on the auxiliary member and a wiring pattern (ground pattern) provided on the printed wiring board can be electrically connected, a semiconductor element on the rear surface of which a potential needs to be placed can be mounted.

(Fifth Embodiment)

Figure 8:
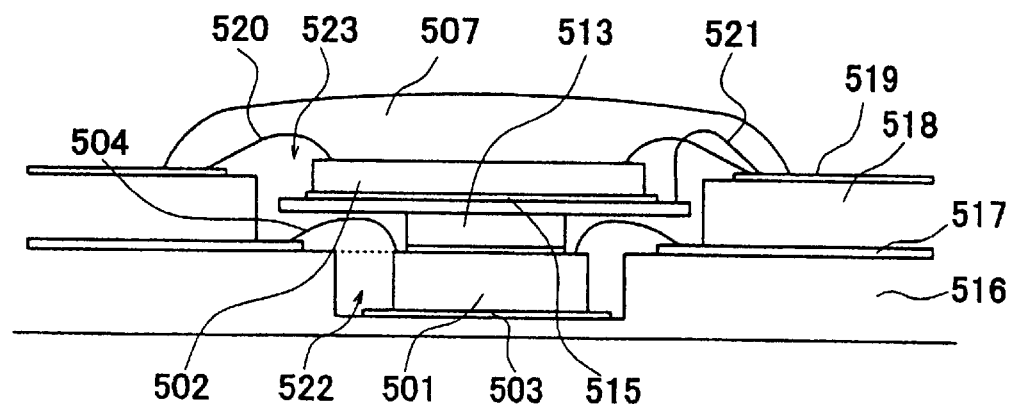
FIG. 8 is a sectional view showing the structure of a semiconductor device in the fifth embodiment.
Figure 9:
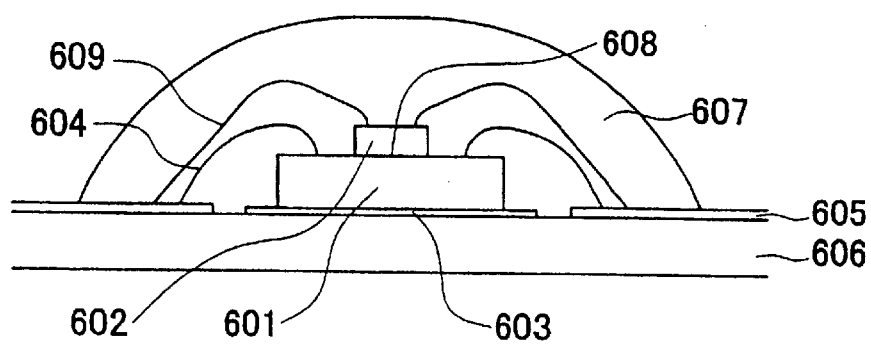
FIG. 9 is a sectional view showing a conventional method for manufacturing a semiconductor device.

In this embodiment, the height at which resin sealing is achieved is lowered to make the film in the semiconductor device thin. Hereafter, the fifth embodiment will be explained in reference to FIG. 8. FIG. 8 is a sectional view showing the structure of a semiconductor device in the fifth embodiment.

As shown in FIG. 8, a printed wiring board used in this embodiment is a multi-layer printed wiring board having a first layer 516 and a second layer 518. A first substantially recessed part 522 with roughly same depth as the height of a first semiconductor element 501 is formed on the first layer 516. And a second substantially recessed part 523 with roughly same depth as the sum of the height of a second semiconductor element 502 and the height of an auxiliary member 513 and which has a diameter larger than that of the first substantially recessed part is formed on the second layer 518 on the first substantially recessed part 522.

The first semiconductor element 501 is adhered to the first substantially recessed part 522 on the first layer 516 on the multi-layer printed wiring board with a die bonding material 503. The first semiconductor element 501 and a wiring pattern 517 provided on the multi-layer printed wiring board (the first layer) 516 are electrically connected to each other via a thin wire for connection (Au wire, Al wire and the like) 504.

In this embodiment, the auxiliary member 513 is mounted on the first semiconductor element 501 and adhered with a die bonding material 503 so that a supporting part with a substantially protruding shape on the auxiliary member 513 may be located within an electrode pad formed at the periphery of the first semiconductor element 501. At this time, the auxiliary member 513 is mounted so as not to change the shape of the thin wire for connection. It is to be noted that the auxiliary member 513 consisting of, for example, an epoxy resin and the like, in this embodiment comprises a member larger than the second semiconductor element by, for example, 0.5 mm, for mounting the second semiconductor element 502 on the surface thereof, and the supporting part with a substantially protruding shape formed on the rear surface of the member.

An electroconductive film (not shown), for example, Au plate and the like, is formed at a predetermined region on the surface of a member in this embodiment including a die bonding part for mounting the second semiconductor element and a connection part for connecting a thin wire for connection with other wiring patterns. It is to be noted that the auxiliary member in this embodiment comprises a member larger than the second semiconductor element by, for example, 0.5 mm. The reason for this is that it is necessary to provide a region for forming a connection part to connect with other wiring patterns.

The second semiconductor element 502 is adhered to a die bonding part on which an electroconductive film is formed with a die bonding material 515.

In addition, the second semiconductor element 502 and the printed wiring board (the second layer) 518 are electrically connected to each other via a thin wire for connection (Au wire, Al wire and the like) 520. The electroconductive film part (cavity part) on the auxiliary part 513 and a wiring pattern (ground pattern) 519 provided on the printed wiring board (the second layer) 518 are electrically connected to each other via a thin wire for connection (Au wire, Al wire and the like) 521.

Further, resin sealing is achieved by an epoxy resin 507 to protect the first semiconductor element 501, the second semiconductor element 502, the auxiliary member 513 and the thin wires for connection 504, 520 and 521.

Hereafter, a method for manufacturing a semiconductor device will be described in this embodiment in reference to FIG. 8.

As shown in FIG. 8, a printed wiring board used in this embodiment is a multi-layer printed wiring board having the first layer 516 and the second layer 518. The first substantially recessed part 522 with roughly same depth as the height of the first semiconductor element 501 is formed on the first layer 516. And the second substantially recessed part 523 with roughly same depth as the sum of the height of the second semiconductor element 502 and the height of an auxiliary member 513 and which has a diameter larger than that of the first substantially recessed part is formed on the second layer 518 on the first substantially recessed part 522.

First, the first semiconductor element 501 is adhered to the first substantially recessed part 522 on the first layer 516 on the multi-layer printed wiring board with the die bonding material 503. The first semiconductor element 501 and the wiring pattern 517 provided on the multi-layer printed wiring board (the first layer) 516 are electrically connected to each other via the thin wire for connection (Au wire, Al wire and the like) 504.

After that, the auxiliary member 513 is mounted on the first semiconductor element 501 and adhered with a die bonding material 503 so that a supporting part with a substantially protruding shape on the auxiliary member 513 may be located within an electrode pad formed at the periphery of the first semiconductor element 501. At this time, the auxiliary member 513 in this embodiment is mounted so as not to change the shape of the thin wire for connection. It is to be noted that the auxiliary member 513 consisting of, for example, an epoxy resin and the like, in this embodiment comprises a member larger than the second semiconductor element by, for example, 0.5 mm, for mounting the second semiconductor element 502 on the surface thereof, and the supporting part with a substantially protruding shape formed on the rear surface of the member.

The electroconductive film (not shown), for example, Au plate and the like, is formed at a predetermined region on the surface of a member in this embodiment including a die bonding part for mounting the second semiconductor element and a connection part for connecting a thin wire for connection with other wiring patterns. It is to be noted that the auxiliary member in this embodiment comprises the member larger than the second semiconductor element by, for example, 0.5 mm. The reason for this is that it is necessary to provide a region for forming a connection part to connect with other wiring patterns.

Next, the second semiconductor element 502 is adhered to the die bonding part on which an electroconductive film is formed with the die bonding material 515.

Then, the second semiconductor element 502 and the printed wiring board (the second layer) 518 are electrically connected to each other via the thin wire for connection (Au wire, Al wire and the like) 520. Further, the electroconductive film part (cavity part) on the auxiliary part 513 and a wiring pattern (ground pattern) provided on the printed wiring board (the second layer) 518 are electrically connected to each other via the thin wire for connection (Au wire, Al wire and the like) 521.

Further, resin sealing is achieved by an epoxy resin 507 to protect the first semiconductor element 501, the second semiconductor element 502, the auxiliary member 513 and the thin wires for connection 504, 520 and 521. Thereby the semiconductor device is completed.

In this embodiment, since a multi-layer printed wiring board having a substantially recessed part the depth of which is adjusted as the thickness of the semiconductor element and auxiliary member to be mounted is used, the height at which resin sealing is achieved is lowered. Thereby the size of the semiconductor device can be thin.

In the above-described invention, since the length of the thin wire for connection can be shorter than the conventional one by the auxiliary member, the shape of the thin wire for connection does not change and the thin wire for connection can be prevented from shorting with the adjacent thin wire for connection, so that the semiconductor device with high reliability can be provided.

What is claimed is:

1. A semiconductor device comprising: a printed wiring board with a wiring pattern;
   a first semiconductor element mounted on a predetermined location on the printed wiring board and having a plane with a first region in which an electrode pad is formed and a second region, the internal region of the first region;
   an auxiliary member mounted on the second region of the first semiconductor element and having a plane with a first region in which a wiring pattern is formed and a second region, the internal region of the first region; and
   a second semiconductor element mounted on the second region of the auxiliary member and having a plane with an electrode pad formed; and
   the semiconductor device wherein: the electrode pad of the first semiconductor element and the wiring pattern of the printed wiring board are electrically connected to each other;
   the electrode pad of the second semiconductor element and the wiring pattern of the auxiliary member are electrically connected to each other;
   the wiring pattern of the auxiliary member and the wiring pattern of the printed wiring board are electrically connected to each other; and
   the first semiconductor element and the second semiconductor element are resin-sealed.

2. A semiconductor device according to claim 1 wherein the auxiliary member is consisting of an epoxy resin.

3. A semiconductor device according to claim 1 wherein the auxiliary member comprises a member having a first plane with the first region and the second region and a second plane opposed to the first plane, and a supporting member having a first plane joined to the second plane of the member and a second plane opposed to the first plane and joined to the first semiconductor element.

4. A semiconductor device according to claim 3 wherein the auxiliary member is consisting of an epoxy resin.

5. A semiconductor device according to claim 3 wherein the area of the second plane of the member is larger than that of the first plane of the supporting member.

6. A semiconductor device according to claim 5 wherein the auxiliary member is consisting of an epoxy resin.

7. A semiconductor device comprising:
   a printed wiring board with a wiring pattern;
   a first semiconductor element mounted on a predetermined location on the printed wiring board and having a plane with a first region in which an electrode pad is formed and a second region, the internal region of the first region;
   an auxiliary member which is mounted on the second region of the first semiconductor element, which comprises a member having a first plane and a second plane opposed to the first plane and a supporting member having a first plane joined to the second plane of the member and a second plane opposed to the first plane and joined to the first semiconductor element and in which the area of the second plane of the member is larger than that of the first plane of the supporting member; and
   a second semiconductor element mounted on the second region of the auxiliary member and having a plane with an electrode pad formed; and
   the semiconductor device wherein: the electrode pad of the first semiconductor element and the wiring pattern of the printed wiring board are electrically connected to each other;
   the electrode pad of the second semiconductor element and the wiring pattern of the printed wiring board are electrically connected to each other; and
   the first semiconductor element and the second semiconductor element are resin-sealed.

8. A semiconductor device according to claim 7 wherein the auxiliary member is consisting of an epoxy resin.

9. A semiconductor device comprising:
   a printed wiring board with a wiring pattern;
   a first semiconductor element mounted on a predetermined location on the printed wiring board and having a plane with a first region in which an electrode pad is formed and a second region, the internal region of the first region;
   an auxiliary member which is mounted on the second region of the first semiconductor element, which comprises a member having a first plane in which an electroconductive film is formed and a second plane opposed to the first plane and a supporting member having a first plane joined to the second plane of the member and a second plane opposed to the first plane and joined to the first semiconductor element and in which the area of the second plane of the member is larger than that of the first plane of the supporting member; and
   a second semiconductor element mounted on the electroconductive film with an electroconductive glue and having a plane with an electrode pad formed; and
   the semiconductor device wherein: the electrode pad of the first semiconductor element and the wiring pattern of the printed wiring board are electrically connected to each other;
   the electrode pad of the second semiconductor element and the wiring pattern of the printed wiring board are electrically connected to each other;
   the electroconductive film and the wiring pattern of the printed wiring board are electrically connected to each other; and
   the first semiconductor element and the second semiconductor element are resin-sealed.

10. A semiconductor device according to claim 9 wherein the auxiliary member is consisting of an epoxy resin.

11. A semiconductor device comprising:

a printed wiring board with a multi-layer structure having a first layer, on which a first substantially recessed part with roughly same depth as the height of a first semiconductor element is formed, and a second layer, on which a second substantially recessed part with roughly same depth as the sum of the height of the second semiconductor element and the height of an auxiliary member and which has a diameter larger than that of the first substantially recessed part is formed, each layer with a wiring pattern;

the first semiconductor element mounted on a predetermined location on the first substantially recessed part and having a plane with a first region in which an electrode pad is formed and a second region, the internal region of the first region;

the auxiliary member which is mounted on the second region of the first semiconductor element, which comprises a member having a first plane in which an electroconductive film is formed and a second plane opposed to the first plane and a supporting member having a first plane joined to the second plane of the member and a second plane opposed to the first plane and joined to the first semiconductor element and in which the area of the second plane of the member is larger than that of the first plane of the supporting member; and the second semiconductor element mounted on the electroconductive film with an electroconductive glue and having a plane with an electrode pad formed; and the semiconductor device wherein: the electrode pad of the first semiconductor element and the wiring pattern of the first layer are electrically connected to each other;

the electrode pad of the second semiconductor element and the wiring pattern of the second layer are electrically connected to each other;

the electroconductive film of the auxiliary member and the wiring pattern of the second layer are electrically connected to each other; and the first semiconductor element and the second semiconductor element are resin-sealed.

12. A semiconductor device according to claim 11 wherein the auxiliary member is consisting of an epoxy resin.

* * * * *